United States Patent [19]

Seki et al.

[11] 3,947,637

[45] Mar. 30, 1976

[54] SIGNAL COMPOSING CIRCUIT

[75] Inventors: Kunio Seki, Hinode; Susumu Takahashi, Tokyo, both of Japan

[73] Assignee: Hitachi, Ltd., Japan

[22] Filed: Sept. 26, 1974

[21] Appl. No.: 509,339

[30] Foreign Application Priority Data

Sept. 26, 1973 Japan .............................. 48-108199
May 8, 1974 Japan .............................. 49-50289

[52] U.S. Cl............ 179/1 GQ; 330/30 R; 330/30 D

[51] Int. Cl.[2]....................... H04R 5/00; H03G 3/30

[58] Field of Search........ 179/1 GQ, 1 G, 100.4 ST; 330/30 R, 30 D, 69, 124, 147, 148

[56] References Cited

UNITED STATES PATENTS

| | | | |
|---|---|---|---|
| 3,178,651 | 4/1965 | Kegelman | 330/30 D |
| 3,482,177 | 12/1969 | Sylvan | 330/30 R |
| 3,706,937 | 12/1972 | Hanna | 330/30 D |
| 3,821,474 | 6/1974 | Ohsawa | 179/1 GQ |
| 3,825,684 | 7/1974 | Ito et al. | 179/1 GQ |

*Primary Examiner*—Douglas W. Olms
*Attorney, Agent, or Firm*—Craig & Antonelli

[57] ABSTRACT

A signal composing circuit suitable for a decoder device of a 4-channel matrix stereophonic system comprises two types of circuit units, one being a differential type circuit in which the common emitters are connected to ground through constant current means, the other having a like circuit arrangement as the differential type circuit but having constant current means shunted with a capacitor so as to ground the common emitters for A.C. signals. The signal composing circuit is suited for monolithic integrated circuits.

10 Claims, 7 Drawing Figures

SIGNAL COMPOSING CIRCUIT

BACKGROUND OF THE INVENTION

1. Field of the Invention

This invention relates to a signal composing circuit and, more particularly, to a signal composing circuit which is suited to a decoder device for a 4-channel matrix stereophonic system.

2. Description of the Prior Art

A decoder device for a 4-channel matrix stereophonic system requires a signal composing circuit which produces signals of predetermined coefficients or composed signals from a plurality of input signals in order to separate stereophonic signals from composite signals. The basic concept of the 4-channel matrix stereophonic system is disclosed by Ito et al in U.S. Pat. No. 3,825,684. An improvement thereof is described in Material No. EA72-32 (1973-03), "Improvements in Encode-Decode System in 4-channel Matrix Reproduction" which was published in the meeting of Denkionkyo Kenkyukai (Meeting of Technical Group of Electroacoustics) joint with Denshitsushin Gakkai (The Institute of Electronics and Communication Engineers of Japan), and with Nihon Onkyo Gakkai (The Acoustical Society of Japan) on Mar. 26, 1973 and which was issued by Denshitsushin Gakkai.

A circuit, which is composed of a plurality of resistors (called as coefficient resistors hereinafter) having one of the ends connected in common as an output terminal and the other ends connected to inputs signals, respectively, is generally known for composing the input signals. When such a circuit is used as a decoder device in a stereophonic system, the decoder device further requires phase inverters whose amplification factors are set at -1 and amplifiers (referred to as fixed coefficient amplifiers hereinafter) whose amplification factors are set at predetermined values such as $-\sqrt{2}$, −2 and +2.

Such a known signal composing circuit, however, has problems as stated below.

1. In order to obtain inverted-phase signals, separate phase inverters which serve only for the function of the phase inversion are required.

2. In order to compose a plurality of signals, coefficient resistors are required, and the resistance value of the coefficient resistors must be made sufficiently lower than the input impedances of the fixed coefficient amplifiers connected to such coefficient resistors, whereas it must be made sufficiently higher than the output impedances of signal sources for driving the coefficient resistors.

3. Since separate coefficient resistors, phase inverters and fixed-coefficient amplifiers are necessary, the circuit arrangement of the signal composing circuit becomes very complicated for obtaining the sum component output signal and the difference component output signal from the plurality of input signals, and the number of the constituent circuits becomes large, with the result that the power consumption becomes high. Moreover, the resistance value of the coefficient resistors is comparatively large. Therefore, to construct the signal composing circuit of such a type into a monolithic semiconductor integrated circuit device (hereinafter termed the monolithic IC) becomes very difficult on account of the allowable power dissipation of the monolithic IC, the heat sink structure of the IC and the integration density of the IC.

4. Since in the respective signal paths from the inputs to the outputs of the signal composing circuit, there are disorderly arranged the coefficient resistors, the phase inverters, the fixed coefficient amplifiers and so forth, where such circuit components are D.C. coupled in order to form the signal composing circuit as an IC, deviations in the D.C. level temperature-dependency, the distortion factor characteristic and the frequency characteristic arise among the respective composite signal output voltages at the composed output terminals.

5. Since the respective signal paths have coefficient resistors with the comparatively high resistance connected in series, large thermal resistance noises are generated.

SUMMARY OF THE INVENTION

Accordingly, it is an object of the invention to provide a signal composing circuit wherein separate phase inverters for obtaining the inverted-phase signals are unnecessary.

It is another object of the invention to provide a signal composing circuit wherein coefficient resistors are unnecessary.

It is a further object of the invention to provide a signal composing circuit wherein deviations in the D.C. level temperature-dependency, distortion factor characteristic and frequency characteristic among the respective composite signal output voltage are small.

It is a still further object of the invention to provide a signal composing circuit whose power consumption is reduced, to facilitate forming the circuit as a monolithic IC.

It is still a further object of the invention to provide a signal composing circuit whose noise characteristic is improved.

One aspect of this invention is characterized in that, in order to obtain composite difference signals from a plurality of input signals, a D.C. emitter-coupled differential type signal composing circuit is utilized, while in order to obtain other composite output signals, a D.C. emitter-coupled signal composing circuit, which has a like circuit arrangement as the D.C. emitter-coupled differential type signal composing circuit but has the commonly connected emitters grounded for A.C. signals, is utilized.

DETAILED DESCRIPTION

A signal composing circuit according to this invention employs two types of circuit units.

Figure 1A:
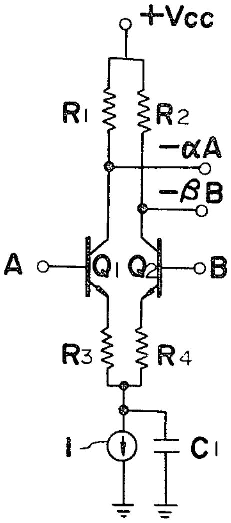
FIGS. 1*a* to 1*c* are circuit diagrams for explaining the basic concept of the invention.
Figure 1B:
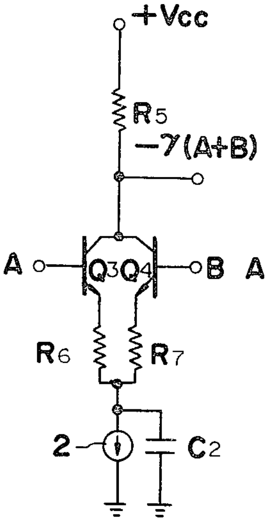
Figure 1C:
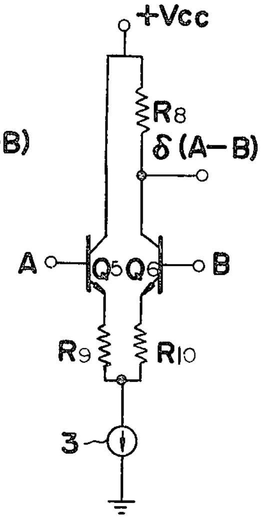

One type of the circuit unit is a differential amplifier whicn, as shown in FIG. 1*c*, comprises a pair of transistors Q5 and Q6 having their emitters connected in common through resistors R9 and R10. The connection point of resistors R9 and R10 is connected to ground through a constant current source 3. The circuit further includes a load resistor R8 through which a power source voltage + Vcc is applied to the collector of transistor Q6, while the collector of transistor Q5 is directly connected to the power source voltage +Vcc.

The other type of circuit unit is an emitter-coupled amplifier which, as shown in FIG. 1*a* or 1*b*, comprises a pair of transistors Q1 and Q2 or Q3 and Q4 having emitters connected in common through resistors R3 and R4 or R6 and R7. The connection point of resistors R3 and R4 or R6 and R7 is connected to ground through a constant current source 1 or 2. Unlike the circuit of FIG. 1*c*, the connection point of resistors R3 and R4 or R6 and R7 is grounded for an A.C. signal through an electric capacitor C1 or C2. Thus, the electrical coupling of the emitters is prevented by the capacitors.

The circuit of FIG. 1*a* further includes load resistors R1 and R2 through which power source voltage +Vcc is applied to the respective collectors of transistors Q1 and Q2. Since the commonly connected emitters are grounded for A.C. signals through the capacitor C1, the circuit of FIG. 1*a* does not function as a differential amplifier but functions as an emitter-common amplifier for A.C. signals and supplies output signals $-\alpha A$ and $\beta B$ from the respective collectors upon receipt of input signals A and B applied to the bases of transistors Q1 and Q2. The values of $\alpha$ and $\beta$ are determined by the resistance ratios R1/R3 and R2/R4, respectively.

The circuit of FIG. 1*b* further includes a load resistor R5 through which power source voltage +Vcc is applied to the commonly connected collectors of transistors Q3 and Q4. Similarly to the circuit of FIG. 1*a*, the circuit of FIG. 1*b* does not function as a differential amplifier and supplies an output signal $-\gamma(A+B)$ upon receipt of input signals A and B. The value of $\gamma$ is determined by the resistance ratio R5/R6 or R5/R7 (R6 = R7).

The circuit of FIG. 1*c* supplies a differential output signal $\delta(A - B)$ upon receipt of input signals A and B. The value of $\delta$ is determined by the resistance ratio R8/(R10 + R9) (R9 = R10).

Figure 2:
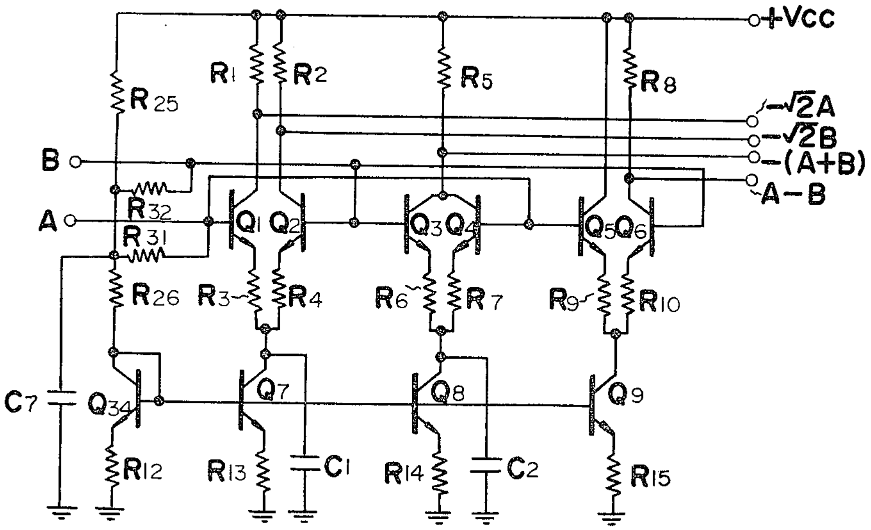
FIGS. 2 to 4 are circuit diagrams of various signal composing circuits employing the instant invention.
Figure 3:
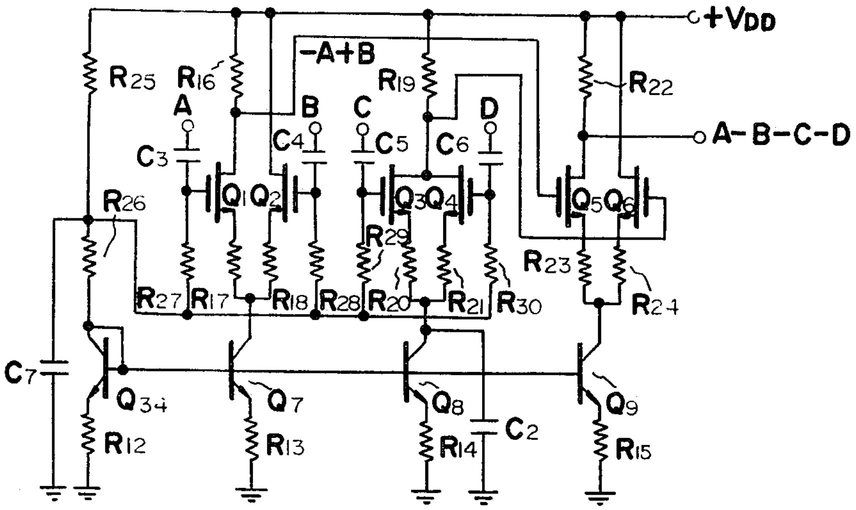
Figure 4:
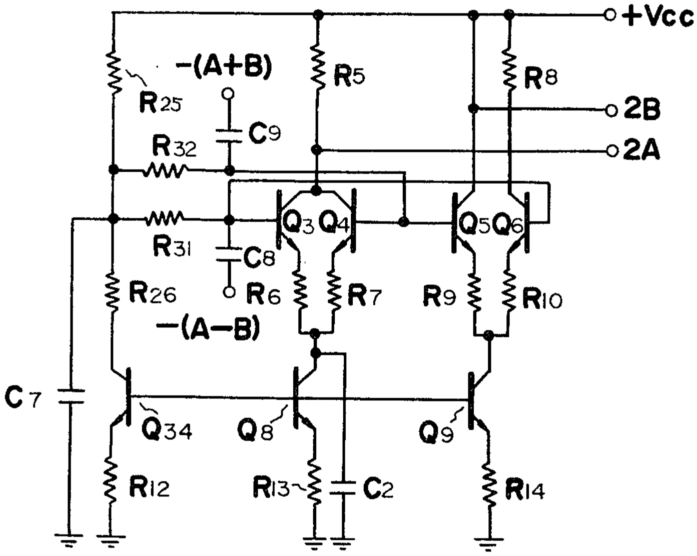

These circuit units of FIGS. 1*a* to 1*c* may be employed in a signal composing circuit as shown in FIGS. 2, 3 or 4.

In FIG. 2, the transistor-resistor combinations Q7 and R13, Q8 and R14 and Q9 and R15 constitute the constant current sources 1 to 3 of FIGS. 1*a*, to 1*c*, respectively. The circuit constituted by transistor Q34, resistors R25, R26, R31 and R32, and capacitor C7 is a bias means for supplying bias currents to the bases of transistors Q1 to Q9. A first input signal A is applied to the bases of transistors Q1, Q4 and Q5, while a second input signal is applied to the bases of transistors Q2, Q3 and Q6. Upon receipt of the input signals, the circuit supplies a set of output signals $-\sqrt{2}A$, $-\sqrt{2}B$, $-(A+B)$ and A–B, where the resistance ratios are selected as follows:

$$\frac{R1}{R3} : \frac{R2}{R4} : \frac{R5}{R6} : \frac{R8}{R9+R10} = \sqrt{2} : \sqrt{2} : 1 : 1$$

(R6 = R7 and R9 = R10).

The bipolar transistors Q1 to Q6 may be replaced by insulated gate field effect transistors as shown in FIG. 3. In the figure, a plurality of signals A to D are applied to the gates of FETs Q1 to Q4, respectively. The output signal $-A + B$ of the differential amplifier which is constituted by FETs Q1 and Q2, and resistors R16 to R18 with the constant current source (Q7 and R13), is applied to the gate of FET Q5, while the output $-(C+D)$ of the source common circuit, which is constituted by FETs Q3 and Q4, and resistors R19 to R21 with the constant current source (Q8 and R14) shunted by the capacitor C2, is applied to the gate of FET Q6. Then, upon receipt of the input signals, the differential amplifier, which is constituted by FETs Q5 and Q6 and resistors R22 to R24 with the constant current source (Q9 and R15), supplies an output signal A-B-C-D.

FIG. 4 shows another signal composing circuit employing the circuit units of FIGS. 1*b* and 1*c*, which, upon receipt of input signals $-(A-B)$ and $-(A+B)$, supplies composite output signals 2A and 2B.

Figure 5:
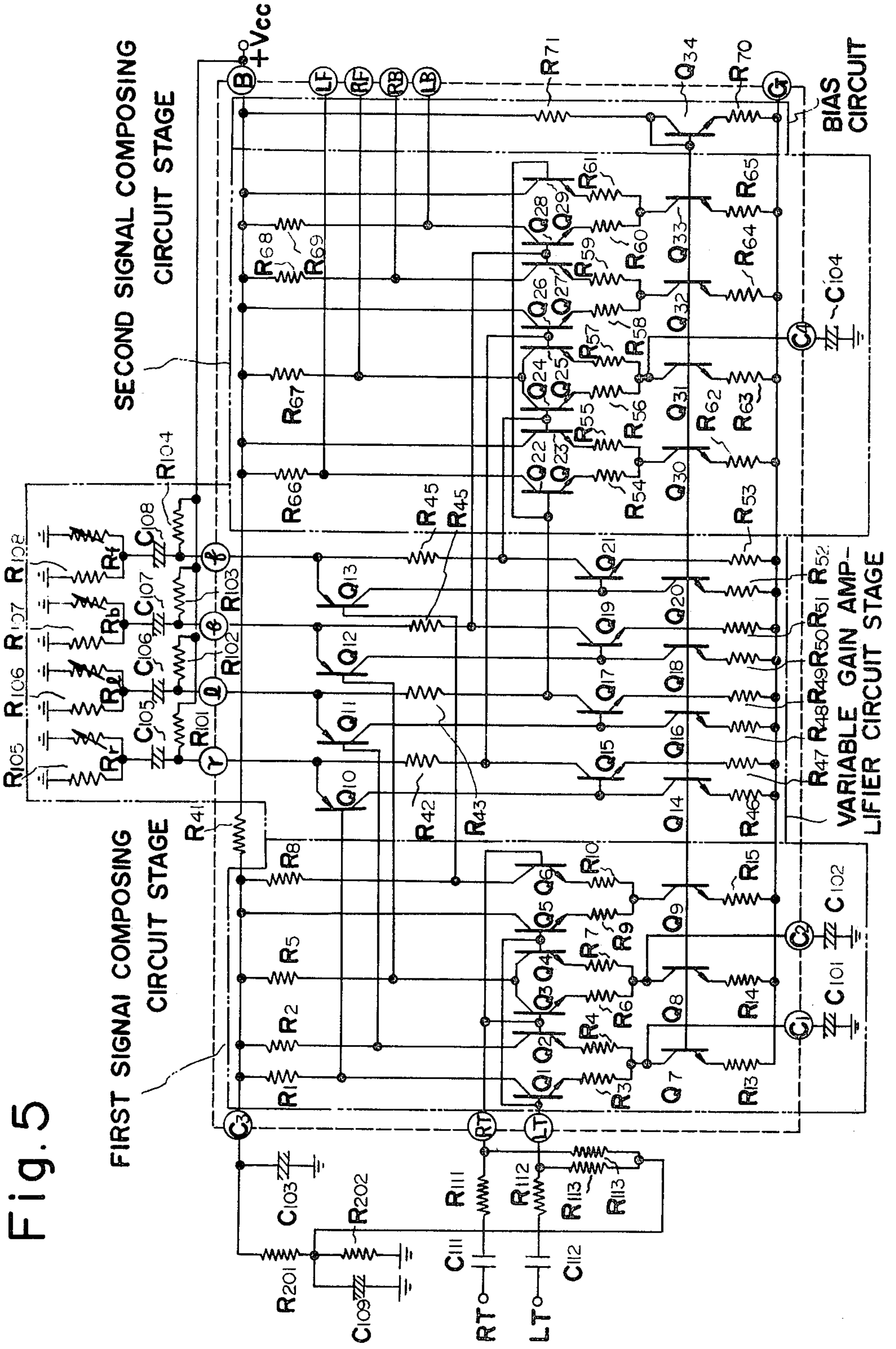
FIG. 5 is a circuit diagram of a decoder circuit of the 4-channel matrix stereophonic system employing a signal composing circuit according to this invention.

A decoder circuit for the 4-channel matrix stereophonic system employing a signal composing circuit according to this invention is shown in FIG. 5.

In the figure, the circuit portions enclosed with broken lines are formed within a single silicon semiconductor substrate be a well-known manufacturing method. (LT), (RT), (C1), (C2), (C3), . . . . . . (B) and (G) are lead terminals (pins) of the monolithic IC.

Right and left 2-channel encode signals RT and LT are applied to the pins (RT) and (LT) through input coupling capacitors C111 and C112 and input coupling resistances R111 and R112, respectively. The first composing circuit stage constituted by transistors Q1 to Q9, resistors R1 to R10 and R13 to R15 and capacitors C101 and C102 has the same circuit configuration as that of FIG. 2. The input signals LT and RT correspond to the input signals A and B in FIG. 2.

Substantially equal D.C. bias voltages obtained from a bias circuit R201, R202 and C109 are applied to the respective combinations of the commonly connected base electrodes of the transistors Q1, Q4 and Q5 and Q2, Q3 and Q6 through resistors R113 and R114. A resistance R41 and a capacitor C103 for removing power supply ripples are connected to the supply voltage feeding line, and they prevent the A.C. ripple component from a voltage supply source from leaking to signal paths.

The first signal composing circuit stage supplies composite output signals $-\sqrt{2}LT$, $-\sqrt{2}RT$, $-(LT+RT)$ and LT–RT from the collectors of transistors Q1, Q2, Q3 (or Q4) and Q6 to the next stage, i.e. the variable gain amplifier circuit stage.

The variable gain amplifier circuit stage comprises four variable gain amplifier circuits, one of which is composed of a P-N-P transistor Q10 as well as N-P-N transistors Q14 and Q15, resistances R42, R46, R47 and R101 and R105, a capacitor C105 and a variable impedance Rr. The transistors Q10 and Q15 are amplifier transistors, constant current circuit Q14 and R46 is a constant current load of the amplifier transistor Q10, and the resistance R42 and the elements R101, C105, R105 and Rr constitute a negative feedback circuit. By controlling the impedance of the variable impedance Rr, the feedback quantity and voltage gain of the negative feedback amplifier circuit can be rendered variable. The other three variable gain amplifier circuits have the same circuit function.

In consequence, an amplified signal of $-(1+r)\sqrt{2}$ LT can be acquired from the output of the first variable gain amplifier circuit including the amplifier transistors Q10 and Q15, an amplified signal of $-(1+l)\sqrt{2}$ RT from the output of the second variable gain amplifier circuit including the amplifier transistors Q11 and Q17, an amplified signal of $-(1 + b)$ (LT + RT) from the third variable gain amplifier circuit including the amplifier transistors Q12 and Q19, and an amplified signal of (1 + f) (LT−RT) from the output of the fourth variable gain amplifier circuit including the amplifier transistors Q13 and Q21.

The second signal composing circuit stage comprises three differential amplifier circuits constituted by transistors Q22 and Q23, resistors R54, R55 and R66 and the constant current source Q30 and R62; transistors Q26 and Q27, resistors R58, R59 and R68 and the constant current source Q32 and R64; and transistors Q28 and Q29, resistors R60, R61 and R69, and the constant current source Q33 and R65, respectively. The three differential amplifier circuits function similarly as the circuit shown in FIG. 1c and supply, upon receipt of the signals at the bases of transistors Q22, Q23, and Q26 to Q29 from the variable gain amplifier circuit stage, output signals $(1+f)(LT-RT)+(1+l)\sqrt{2}RT$, $(1+b)(LT+RT)-(1+r)\sqrt{2}LT$, and $(1+b)(LT+RT)-(1+l)\sqrt{2}RT$ from the terminals (LF), (RB) and (LB), respectively.

The second signal composing circuit stage further comprises an emitter-coupled amplifier circuit constituted by transistors Q24 and Q25, resistors R56, R57 and R67 and the constant current source Q31 and R63 shunted with capacitor C104. The emitter coupled amplifier circuit functions similarly as the circuit shown in FIG. **1*b* and supplies, upon receipt of the signals at the bases of transistors Q24 and Q25** from the variable gain amplifier circuit stage, an output signal $-(1+f)(LT-RT)+(1+r)\sqrt{2}LT$ from the terminal (RF).

In the second signal composing circuit stage, resistor ratios are set at follows:

$$\frac{R66}{R54+R55} : \frac{R67}{R56} : \frac{R68}{R58+R59} : \frac{R69}{R60+R61} = 1:1:1:1$$

$(R_{56}=R_{57})$.

The values of the resistances, the capacitors and the supply voltage used in the circuit illustrated in FIG. 5 are listed in the following table:

TABLE

| | | | |
|---|---|---|---|
| R1,R2 | 2.0 | k | Ω |
| R3,R4 | 5.18 | k | Ω |
| R5 | 1.0 | k | Ω |
| R6,R7 | 3.62 | k | Ω |
| R8 | 2.0 | k | Ω |
| R9,R10 | 3.62 | k | Ω |
| R13,R14,R15 | 0.765 | k | Ω |
| R41 | 5.5 | k | Ω |
| R42 to R45 | 3.46 | k | Ω |
| R46,R48,R50,R52 | 8.5 | k | Ω |
| R47,R49,R51,R53 | 0.5 | k | Ω |
| R54 to R61 | 5.0 | k | Ω |
| R62 to R65 | 0.5 | k | Ω |
| R70 | 0.5 | k | Ω |
| R71 | 19.5 | k | Ω |
| R66,R68 and R69 | 10.0 | k | Ω |
| R67 | 5.0 | k | Ω |
| R101 to R104 | 15.0 | k | Ω |
| R105 to R108 | 1.5 | k | Ω |
| R111, R112 | 82.0 | k | Ω |
| R113,R114 | 22.0 | k | Ω |
| R201 | 15.0 | k | Ω |
| R202 | 6.8 | k | Ω |
| C101, C102 and C104 | 47 | μF | |
| C103 | 100 | μF | |
| C105 to C108 | 10 | μF | |
| C111, C112 | 1.0 | μF | |
| C109 | 100 | μF | |
| +Vcc | 25.0 | V | |

The bias circuit comprises a transistor Q34 and resistors R70 and R71 and is connected to the base electrodes of the constant current transistors Q7, Q8, Q9, Q30, Q31, Q32, and Q33 in the constant current sources, for supplying a common bias voltage, respectively. Because the values of the resistors R13, R14 and R15 in the constant current sources are set equal to each other, the D.C. constant current flowing in the constant current transistors Q7, Q8, and Q9 become substantially equal to each other. And furthermore, because the resistance values of the resistors R1, R2, R8 are set equal to each other, and the resistance value of the resistor R5 is set equal to half that of the resistor R1, the D.C. levels of the output signals which are derived from the resistors R1, R2, R5 and R8, become substantially equal to each other. Namely, the D.C. collector voltages of transistors Q1, Q2, Q3, Q4 and Q6 become equal to each other.

As shown in the above table, the values of the resistances R101 to R104 are equal to each other. Also, the values of the resistances R42 to R45 are equal to each other and, the values of the resistances R46, R48, R50 and R52 are equal to each other. Therefore, the D.C levels of the output signal which are derived from the collector electrodes of the transistors Q15, Q17, Q19 and Q21, that is, the D.C. collector voltages thereof, become substantially equal to each other.

Further, the D.C. costant currents of the constant current transistors Q30 to Q33 become substantially equal to each other, because the values of the resistances R62 and R65 are equal to each other. And furthermore, the values of resistances R66, R68 and R69 are set equal to each other, and the value of resistance R67 is set equal to half that of the resistance R66. As a result, the D.C. levels of the output signals which are derived from the resistors R66 to R69, that is, the D.C. collector voltages of transistors Q22, Q24, Q27 and Q28 become substantially equal to each other.

On the other hand, the D.C. constant bias currents in all types of circuit units in the first and second signal composing circuit stages are commonly provided by one bias circuit. Therefore, it has become possible to make the deviations in the D.C. level temperature-dependency, the distortion factor characteristics and the frequency characteristics among the respective output signals of the all types of circuit units small.

The values of the resistances R1-R10, R13-R15 and R41-R71 mentioned in the above table are those of resistances formed in the monolithic IC by impurity diffusion. This invention, however, is not restricted to such monolithic IC only, but it can be employed by connecting discrete circuit elements.

The impedances of the variable impedances Rr, Rl, Rb and Rf are actually controlled using the drain-source conductances of P-channel MOS type field-effect transistors which are electronically controlled by voltages to be applied to the gate electrodes.

In accordance with the construction and embodiment of the invention of this application, the expected objects can be accomplished for the reasons stated below.

1. Phase inverting action is carried out between the base electrodes and the collector electrodes of the transistors in the respective D.C. emitter-coupled signal composing circuits. The separate phase inverters have, therefore, become unnecessary.
2. The relative voltage amplitude value ratios among the D.C. emitter-coupled signal composing circuits, that is, the coefficients of the signals can be set by the resistance ratios between the emitter resistances and the load resistances of the D.C. emitter-coupled signal composing circuits. The coefficient resistors heretofore used only for setting the fixed coefficients have become unnecessary.

3. In the signal paths extending from the input terminals to the signal output terminals of the signal composing circuit stages, the D.C. emitter-coupled type signal composing circuits similar in the circuit type are arranged. It has therefore become possible to make the deviations in the D.C. level temperaturedependency, the distortion factor characteristic and the frequency characteristic among the respective composite signal outputs small.
4. Since the circuit arrangement is simplified for the reason that the separate phase inverters and the coefficient resistors are eliminated, power consumption has been reduced. Also, since coefficient resistors of comparatively large resistance value become unnecessary, it has become easy to put the circuit into the form of the monolithic IC.
5. In the respective signal paths, the coefficient resistors of high resistances are not connected in series. It has, therefore, become possible to lower the thermal noise level and to improve the noise characteristic.

This invention is not restricted to the foregoing embodiments but it can adopt various aspects of performance. For example, the D.C. emitter-coupled type signal composing circuit may be replaced by a D.C. grounded electrode-coupled type signal composing circuit which utilizes amplifier elements other than the bipolar transistors, such as MOS type field-effect transistors and junction type field-effect transistors.

Furthermore, the invention of this application is not restricted to the decoder of the 4-channel matrix stereophonic system, but it is applicable to all the cases of acquiring in-phase or inverted-phase signals of independent multi-input signals and acquiring the sum signal and the difference signal of these signals. For example, in case of acquiring a signal − RT, a signal RT may be applied to the base of the transistor Q6 without applying any signal to the base of the transistor Q5.

While we have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim is:

1. A signal composing circuit for obtaining a plurality of output signals which are a function of a plurality of input signals comprising:

first means for obtaining an output signal which is representative of the inversion of an input signal applied thereto, including a first and a second amplifier element each having a first, a second and a third electrode, a first and a second resistive element one of the ends of which are connected to the first electrodes of said first and second amplifier element, respectively, the other ends of said first and second resistive elements being connected in common, first constant current means connected between the commonly connected other ends of the first and second resistive elements and ground potential, first load means connected between said second electrode of said first amplifier element and a voltage supply, and first bias means, connected to the third electrodes of said first and second amplifier elements, for supplying substantially equal D.C. bias voltages to the third electrodes thereof, respectively, said input signal being applied to said third electrode of the first amplifier element, and said output signal being derived from said first load means; and second means for obtaining an output signal which is representative of the difference of two input signals applied thereto, including a third and a fourth amplifier element each having a first, a second and a third electrode, a third and a fourth resistive element one of the ends of which are connected to the first electrodes of said third and fourth amplifier elements, respectively, the other ends of said third and fourth resistive elements being connected in common, second constant current means connected between said commonly connected other ends of the third and fourth resistive elements and ground potential, second load means, having a resistance value which is substantially equal to that of said first load means, connected between the second electrode of one of said third and fourth amplifier elements and said voltage supply, second bias means, connected to the third electrodes of said third and fourth amplifier elements, for supplying substantially equal D.C. bias voltages to the third electrodes thereof, respectively, said two input signals being applied to the third electrodes of said third and fourth amplifier elements, respectively, and said latter output signal which is the difference between said two input signals, being derived from said second load means; and third bias means, connected to said first and second constant current means, for causing each D.C. constant current of said first and second constant current source means to be substantially equal to each other, whereby the D.C. levels of said output signals of said first and second means are subtantially equal to each other.

2. A signal composing circuit for obtaining a plurality of output signals which are a function of a plurality of input signals comprising:

first means for obtaining two output signals which are representative of the inversions of two input signals, respectively, applied thereto, including:

a first and second amplifier element each having a first, a second, and a third electrode, a first and a second resistive element one of the ends of which are connected to the first electrodes of said first and second amplifier elements, respectively, the other ends of said first and second resistive elements being connected in common, first constant current means connected to the commonly connected other ends of the first and second resistive elements and ground potential, first load means connected between said second electrode of said first amplifier element and a voltage supply, second load means, having a resistance value which is substantially equal to that of said first load means, connected between said second electrode of said second amplifier element and said voltage supply, capacitive means connected in parallel with said first constant current means for grounding the commonly connected other ends of the first and second resistive elements for an A.C. signal, and first bias means, connected to the third electrodes of said first and second amplifier elements, for supplying substantially equal D.C. bias voltages to the third electrodes thereof respectively, said two input signals being applied to said third electrodes of the first and second amplifier elements respectively, and said two output signals being derived from said first and second load means, respectively; and second means for obtaining an output signal which is representative of the difference of two input signals applied thereto, including a third and a fourth amplifier element each having a first, a second, and a third electrode, a third and a fourth resistive element one of the ends of which are connected to the first electrodes of said third and fourth amplifier elements, respectively, the other ends of said third and fourth resistive elements being connected in common, second constant current means connected between the commonly connected other ends of the third and fourth resistive elements and ground potential, third load means, having a resistance value which is substantially equal to that of said first load means, connected between the second electrode of one of said second and third amplifier elements and said voltage supply, and second bias means, connected to the third electrodes of said third and fourth amplifier elements, for supplying substantially equal D.C. bias voltages to the electrodes thereof, respectively, said latter two input signals being applied to the third electrodes of said fourth amplifier elements, respectively, and said output signal, which is the difference between said latter two input signals, being derived from said third load means; and third bias means, connected to said first and second constant current means, for causing each D.C. constant current of said first and second constant current source means to substantially equal to each other, whereby the D.C. levels of said output signals of said first and second means are substantially equal to each other.

3. A signal composing circuit for obtaining a plurality of output signals which are a function of a plurality of input signals comprising:

first means for obtaining an output signal which is representative of the difference of two input signals applied thereto, including a first and a second amplifier element each having a first, a second and a third electrode, a first and a second resistive element one of the ends of which are connected to the first electrodes of said first and second amplifier elements, respectively, the other ends of said first and second resistive elements being connected in common, first constant current means connected between the commonly connected other ends of the first and second resistive elements and ground potential, first load means connected between the second electrode of one of said first and second amplifier elements and a voltage supply, first bias means, connected to the third electrodes of said first and second amplifier elements, for supplying substantially equal D.C. bias voltages to third electrodes thereof, respectively, said two input signals being applied to the third electrodes of said first and second amplifier elements respectively, and the output signal, which is a difference between said input signals, being derived from said first load means; and second means for obtaining a sum signal of two input signals applied thereto, including a third and a fourth amplifier element each having a first, a second and a third electrode, a third and a fourth resistive element, one of the ends of which are connected to the first electrodes of said third and fourth amplifier elements, respectively, the other ends of which are connected in common, second constant current means connected between the commonly connected other ends of the third and fourth resistive elements and ground potential, capacitive means connected in parallel with said second constant current means for grounding the other ends of the third and fourth resistive elements for an A.C. signal, means for connecting the second electrodes of said third and fourth amplifier element in common, second load means, having a resistance value which is substantially equal to half that of said first load means, connected between the commonly connected second electrodes of said third and fourth amplifier elements and said voltage supply, second bias means, connected to the third electrodes of said third and fourth amplifier elements, for supplying substantially equal D.C. bias voltages to said third electrodes, thereof, respectively, said latter two input signals being applied to said third electrodes of said third and fourth amplifier elements and said output signal representative of the sum of said latter two input signals being derived from said second load means; and third bias means, connected to said first and second constant current means, for causing each D.C. constant current of said first and second constant current source means to be substantially equal to each other, whereby the D.C. levels of said output signals of said first and second means are substantially equal to each other.

4. The circuit of claim 3, further comprising
third means for obtaining a difference signal of the output signals of said first and second means, including
a fifth and a sixth amplifier element each having a first, a second and a third electrode,
a fifth and a sixth resistive element one of the ends of which are connected to the first electrodes of said fifth and sixth amplifier elements, respectively, the other ends of which are connected in common,
third constant current means connected between the commonly connected other ends of the fifth and sixth resistive elements and ground potential,
third load means connected between second electrode of one of said fifth and sixth amplifier elements and the voltage supply, and
means for directly supplying said third electrodes of said fifth and sixth amplifier elements with said output signals of said first and second means in a D.C. coupling condition, respectively.

5. A signal composing circuit for obtaining a plurality of output signals which are a function of a plurality of input signals comprising:
first means for obtaining an output signal which is representative of the inversion of an input signal applied thereto, including
a first and a second amplifier element each having a first, a second and a third electrode,
a first and a second resistive element one of the ends of which are connected to the first electrodes of said first and second amplifier elements respectively, the other ends of said first and second resistive elements being connected in common,
first constant current means connected between the commonly connected other ends of the first and second resistive elements and ground potential,
first load means connected between said second electrode of said first amplifier element and a voltage supply, and
first bias means, connected to the third electrodes of said first and second amplifier elements, for supplying substantially equal D.C. bias voltages to the third electrodes thereof respectively,
said input signal being applied to said third electrode of the first amplifier element, and said output signal being derived from said first load means; and
second means for obtaining a sum signal of two input signals applied thereto, including
a third and a fourth amplifier element each having a first, a second and a third electrode,
a third and a fourth resistive element, one of the ends of which are connected to the first electrodes of said third and fourth amplifier elements, respectively, the other ends of which are connected in common,
second constant current means connected between the commonly connected other ends of the third and fourth resistive element and ground potential,
capacitive means connected in parallel with said second constant current means for grounding the other ends of the third and fourth resistive elements for an A.C. signal,
means for connecting the second electrodes of said third and fourth amplifier element in common,
second load means, having a resistance value which is substantially equal to half that of said first load means, connected between the commonly connected second electrodes of said third and fourth amplifier elements and said voltage supply,
second bias means, connected to the third electrodes of said third and fourth amplifier elements, for supplying substantially equal D.C. bias voltages to said third electrodes, thereof, respectively,
said latter two input signals being applied to said third electrodes of said third and fourth amplifier elements and said output signal representative of the sum of said latter two input signals being derived from said second load means; and
third bias means, connected to said first and second constant current means, for causing each D.C. constant current of said first and second constant current source means to be substantially equal to each other, whereby the D.C. levels of said output signals of said first and second means are substantially equal to each other.

6. A signal composing circuit for obtaining a plurality of output signals which are a function of a plurality of input signals comprising:
first means for obtaining the inversions of two input signals, respectively applied thereto, including
a first and a second amplifier element each having a first, a second, and a third electrode,
a first and a second resistive element one of the ends of which are connected to the first electrodes of said first and second amplifier elements, respectively, the other ends of said first and second resistive elements being connected in common,
first constant current means connected between the commoniy connected other ends of the first and second resistive elements and ground potential,
first load means connected between said second electrode of said first amplifier element and a voltage supply,
second load means, having a resistance value which is substantially equal to that of said first load means, connected between said second electrode of said second amplifier element and said voltage supply,
capacitive means, connected in parallel with said first constant current means, for grounding the commonly connected other ends of the first and fourth resistive elements for an A.C. signal, and
first bias means, connected to the third electrodes of said first and second amplifier elements, for supplying substantially equal D.C. bias voltages to the third electrodes thereof, respectively,
said two input signals being applied to said third electrodes of the first and second amplifier elements, respectively, and said two output signals derived from said first and second load means, respectively; and
second means for obtaining a sum signal of two input signals applied thereto, including
a third and a fourth amplifier element each having a first, a second and a third electrode,
a third and a fourth resistive element, one of the ends of which are connected to the first electrodes of said third and fourth amplifier elements, respectively, the other ends of which are connected in common, second constant current means connected between the commonly connected other ends of the third and fourth resistive elements and ground potential, capacitive means, connected in parallel with said second constant current means, for grounding the other ends of the third and fourth resistive elements for an A.C. signal, means for connecting the second electrodes of said third and fourth amplifier elements in common, third load means, having a resistance value which is substantially equal to half that of said first load means, connected between the commonly connected second electrodes of said third and fourth amplifier element and said voltage supply, second bias means, connected to the third electrodes of said third and fourth amplifier elements, for supplying substantially equal D.C. bias voltages to said third electrodes of said third and fourth amplifier elements, respectively, said two input signals being applied to the third electrodes of said third and fourth amplifier elements and the output signal representative of the sum of said latter two input signals being derived from said third load means; and third bias means, connected to said first and second constant current means, for causing each D.C. constant current of said first and second constant current source means to be substantially equal to each other, whereby the D.C. levels of said output signals of said first and second means are substantially equal to each other.

7. A signal composing circuit for obtaining a plurality of output signals which are a function of a plurality of input signals comprising:

first means for obtaining two output signals which are representative of the inversions of two input signals, respectively, applied thereto, including a first and a second amplifier element each having a first, a second and a third electrode, a first and a second resistive element one of the ends of which are connected to the first electrodes of said first and second amplifier elements, the other ends of said first and second resistive elements being connected in common, first constant current means connected between the commonly connected other ends of the first and second resistive elements and ground potential, first load means connected between said second electrode of said first amplifier element and a voltage supply, second load means, having a resistance value which is substantially equal to that of said first load means, connected between said second electrode of said second amplifier element and said voltage supply, capacitive means connected in parallel with said first constant current means for grounding the commonly connected ends of the first and second resistive elements for an A.C. signal, and first bias means, connected to the third electrodes of said first and second amplifier elements, for supplying substantially equal D.C. bias voltages to the third electrodes thereof, respectively, said two input signals being applied to said third electrodes of the first and second amplifier elements, respectively, and said two output signals being derived from said first and second load means, respectively;

second means for obtaining an output signal which is representative of the difference of two input signals applied thereto, including a third and a fourth amplifier element each having a first, a second and a third electrode, a third and a fourth resistive element one of the ends of which are connected to the first electrodes of said third and fourth amplifier elements, respectively, the other ends of said third and fourth resistive elements being connected in common, second constant current means connected between the commonly connected other ends of the third and fourth resistive elements and ground potential, third load means, having a resistance value which is substantially equal to that of said first load means, connected between said second electrode of one of said third and fourth amplifier elements and said voltage supply, and second bias means, connected to the third electrodes of said third and fourth amplifier elements, for supplying substantially equal D.C. bias voltages to the third electrodes thereof, respectively, said two input signals of the second means being applied to said third electrodes of said third and fourth amplifier elements, respectively, and the output signal, which is the difference between said two input signals of the second means, being derived from said third load means;

third means for obtaining a sum signal of two input signals applied thereto, including a fifth and a sixth amplifier element each having a first, a second and a third electrode, a fifth and a sixth resistive element, one of the ends of which are connected to the first electrodes of said fifth and sixth amplifier elements, respectively, the other ends of which are connected in common, third constant current means connected between the commonly connected other ends of the fifth and sixth resistive elements and ground potential, capacitive means connected in parallel with said third constant current means for grounding the other ends of the fifth and sixth resistive elements for an A.C. signal, means for connecting the second electrodes of said fifth and sixth amplifier elements in common, fourth load means, having a resistance value which is substantially equal to half that of said first load means, connected between the commonly connected second electrodes of said fifth and sixth amplifier elements and said voltage supply, third bias means, connected to the third electrodes of said fifth and sixth amplifier elements, for supplying substantially equal D.C. bias voltages to said third electrodes of said fifth and sixth amplifier elements, respectively, said two input signals of the third means being applied to the third electrodes of said fifth and sixth amplifier elements and an output signal representative of the sum of said two input signals of the third means being derived from said fourth load means; and fourth bias means, connected to said first, second and third constant current means, for causing each D.C. constant current of said first, second and third constant current source means to be substantially equal to each other, whereby the D.C. levels of said output signals of said first, second and third means are substantially equal to each other.

8. A signal composing circuit for obtaining a plurality of output signals which are a function of a plurality of input signals comprising:

first means for obtaining two output signals which are representative of the two inversions of two input signals, respectively, applied thereto, including a first and a second amplifier element each having a first, a second and a third electrode, a first and a second resistive element one of the ends of which are connected to the first electrodes of said first and second amplifier elements, the other ends of said first and second resistive elements being connected in common, first constant current means connected between the commonly connected other ends of the first and second resistive elements and ground potential, first load means connected between said second electrode of said first amplifier element and a voltage supply, second load means, having a resistance value which is substantially equal to that of said first load means, connected between said second electrode of said second amplifier element and said voltage supply, and first capacitive means connected in parallel with said first constant current means for grounding the commonly connected other ends of the first and second resistive elements for an A.C. signal;

second means for obtaining an output signal which is representative of the difference of two input signals applied thereto, including a third and a fourth amplifier element each having a first, a second and third electrode, a third and a fourth resistive element one of the ends of which are connected to the first electrodes of said third and fourth amplifier elements, respectively, the other ends of said third and fourth resistive elements being connected in common, second constant current means connected between the commonly connected other ends of the third and fourth resistive elements and ground potential, and third load means, having a resistance value which is substantially equal to that of said first load means, connected between said second electrode of one of said third and fourth amplifier elements and said voltage supply;

third means for obtaining a sum signal of two input signals applied thereto, including a fifth and sixth amplifier element each having a first, a second and a third electrode, a fifth and a sixth resistive element, one of the ends of which are connected to the first electrodes of said fifth and sixth amplifier elements, respectively, the other ends of which are connected in common, third constant current means connected between the commonly connected the other ends of the fifth and sixth resistive elements and ground potential, second capacitive means connected in parallel with said third constant current means for grounding the other ends of the fifth and sixth resistive elements for an A.C. signal, means for connecting the second electrodes of said fifth and sixth amplifier elements in common, fourth load means having a resistance value which is substantially equal to half that of said first load means, connected between the commonly connected second electrodes of said fifth and sixth amplifier elements and said voltage supply;

first bias means, connected to the third electrodes of said first, second, third, fourth, fifth and sixth amplifier elements, for supplying substantially equal D.C. bias voltages to third electrodes thereof, respectively;

first input means, connected to the third electrode of said first, third and sixth amplifier elements, for supplying a first input signal to the third electrodes thereof;

second input means, connected to the third electrode of said second, fourth and fifth amplifier elements, for supplying a second input signal to the third electrodes thereof;

a first output terminal, connected to the second electrode of said first amplifier element, for deriving a first output signal which is representative of the inversion of said first input signal;

a second output terminal, connected to the second electrode of said second amplifier element, for deriving a second output signal which is representative of the inversion of said second input signal;

a third output terminal, connected to the second electrode of one of said third and fourth amplifier elements, for deriving a third output signal which is representative of the difference of said first and second input signals;

a fourth output terminal, connected to the commonly connected second electrodes of said fifth and sixth amplifier elements, for deriving a fourth output signal which is representative of the sum of said first and second input signals; and second bias means, connected to said first, second and third constant current means, for causing each D.C. constant current of said first, second and third constant current means to be substantially equal to each other, whereby the D.C. levels on said first, second, third and fourth output terminals are substantially equal to each other.

9. A four-channel matrix sterophonic decoder circuit for obtaining four decoded output signals which are a function of two encoded input signals comprising:

a first signal composing circuit stage having first means for obtaining first and second output signals which are representative of the inversions of said two encoded input signals, respectively, applied thereto, including a first and a second amplifier element each having a first, a second and third electrode, a first and a second resistive element one of the ends of which are connected to the first electrodes of said first and second amplifier elements, the other ends of said first and second resistive elements being connected in common.

first constant current means connected between the commonly connected other ends of the first and second resistive elements and ground potential, first load means connected between said second electrode of said first amplifier element and a voltage supply, second load means, having a resistance value which is substantially equal to that of said first load means, connected between said second electrode of said second amplifier element and said voltage supply, first capacitive means, connected in parallel with said first constant current means, for grounding the commonly connected other ends of the first and second resistive elements for an A.C. signal, and first bias means, connected to the third electrodes of said first and second amplifier elements, for supplying substantially equal D.C. bias voltages to the third electrodes thereof respectively, said two encoded input signals being applied to said third electrodes of the first and second amplifier elements respectively, and said first and second output signals of said first means being derived from said first and second load means, respectively;

second means for obtaining an output signal which is representative of the difference of said two encoded input signals, respectively, applied thereto, including a third and a fourth amplifier element each having a first, a second and a third electrode, a third and a fourth resistive element one of the ends of which are connected to the first electrodes of said third and fourth amplifier element, the other ends of said third and fourth resistive elements being connected in common, second constant current means connected between the commonly connected other ends of the third and fourth resistive elements and ground potential, third load means, having a resistance value which is substantially equal to that of said first load means, connected between said second electrode of said third amplifier element and said voltage supply, and second bias means, connected to the third electrodes of said third and fourth amplifier elements, for supplying substantially equal D.C. bias voltages to the third electrodes, respectively, said two encoded input signals being applied to said third electrodes of the third and fourth amplifier elements respectively, and said output signal of said second means being derived from said third load means, third means for obtaining an output signal which is representative of the sum of said two encoded input signals, respectively, applied thereto, including a fifth and a sixth amplifier element each having a first, a second and a third electrode, a fifth and a sixth resistive element, one of the ends of which are connected to the first electrodes of said fifth and sixth amplifier elements, respectively, the other ends of which are connected in common, third constant current means connected between the commonly connected other ends of the fifth and sixth resistive elements and ground potential, second capacitive means, connected in parallel with said third constant current means, for grounding the other ends of the fifth and sixth resistive elements for an A.C. signal, means for connecting the second electrodes of said fifth and sixth amplifier element in common, fourth load means, having a resistance value which is substantially equal to half that of said first load means, connected between the commonly connected second electrodes of said fifth and sixth amplifier elements and voltage supply, and third bias means connected to the third electrodes of said fifth and sixth amplifier elements, for supplying substantially equal D.C. bias voltages to the third electrodes, respectively, said two encoded input signals being applied to said third electrodes of the fifth and sixth amplifier elements respectively, and said output signal of said third means being derived from said fourth load means, and fourth bias means, connected to said first, second, and third constant current means, for causing each current of said first, second and third constant current means to be substantially equal to each other, whereby the D.C. levels of said output signals of said first, second and third means are substantially equal to each other;

a variable gain amplifier circuit stage for controlling the amplitude of the output signals of said first signal composing circuit, including a first, a second, a third and a fourth variable gain amplifier circuit each having an input terminal and an output terminal, for controlling the amplitude of a signal supplied to its input terminal, the D.C. levels at said output terminals of said variable gain amplifier circuits being substantially equal to each other, means for supplying the input terminal of said first variable gain amplifier circuit with the first output signal of said first means, means for supplying the input terminal of said second variable gain amplifier circuit with the second output signal of said first means, means for supplying the input terminal of said third variable gain amplifier circuit with the output signal of said third means, and means for supplying the input terminal of said fourth variable gain amplifier dircuit with the output signal of said second means; and a second signal composing circuit stage having fourth means for obtaining a first decoded output signal, including a seventh and a eighth amplifier element each having a first, a second and a third electrode, a seventh and a eighth resistive element one of the ends of which are connected to the first electrodes of said seventh and eighth amplifier elements, the other ends of said seventh and eighth resistive elements being connected in common, fourth constant current means connected between the commonly connected other ends of the seventh and eighth resistive elements and ground potential, and fifth load means connected between said second electrode of said seventh amplifier element and said voltage supply, fifth means for obtaining a second decoded output signal, including a ninth and a 10th amplifier element each having a first, a second and a third electrode, a ninth and a 10th resistive element one of the ends of which are connected to the first electrodes of said ninth and 10th amplifier elements, the other ends of said ninth and 10th resistive elements being connected in common, fifth constant current means connected between the commonly connected other ends of the ninth and 10th resistive elements and ground potential, third capacitive means, connected in parallel with said fifth constant current means, for grounding the other ends of the ninth and 10th resistive elements for an A.C. signal, means for connecting the second electrodes of said ninth and 10th amplifier elements in common, and sixth load means, having a resistance value which is substantially equal to half that of said fifth load means, connected between the commonly connected second electrodes of said ninth and 10th amplifier elements and said voltage supply, sixth means for obtaining a third decoded output signal, including an 11th and a 12th amplifier element each having a first, a second and third electrode, an 11th and a 12th resistive element one of the ends of which are connected to the first electrodes of said 11th and 12th amplifier elements, the other ends of said 11th and 12th resistive elements being connected in common, sixth constant current means connected between said commonly connected the other ends of the 11th and 12th resistive elements and ground potential and seventh load means having a resistance value which is substantially equal to that of said fifth load means, connected between the second electrode of said 12th amplifier element and said voltage supply, seventh means for obtaining a four decoded output signal, including a 13th and a 14th amplifier element each having a first, a second and a third electrode, a 13th and a 14th resistive element one of the ends of which are connected to the first electrodes of said 13th and 14th amplifier elements, the other ends of said 13th and 14th resistive elements being connected in common, seventh constant current means connected between the commonly connected the other ends of the 13th and 14th resistive elements and ground potential, and eighth load means, having a resistance value which is substantially equal to that of said fifth load means, connected between the second electrode of said 13th amplifier element and said voltage supply;

means for connecting the output terminal of said first variable gain amplifier circuit to the third electrodes of said 10th and 11th amplifier elements;

means for connecting the output terminal of said second variable gain amplifier circuit to the third electrodes of said seventh and 14th amplifier elements;

means for connecting the output terminal of said second variable gain amplifier circuit to the third electrodes of said seventh and 14th amplifier elements; and means for connecting the output terminal of said third variable gain amplifier circuit to the third electrodes of said 12th and 13th amplifier elements; and means for connecting the output terminal of said fourth variable gain amplifier circuit to said third electrodes of said eighth and ninth amplifier elements, fifth bias means, connected to said fourth, fifth, sixth and seventh constant current means, for causing each current of said fourth, fifth, sixth and seventh constant current means to be substantially equal to each other, whereby the D.C. levels of said four decoded output signals are substantially equal to each other.

10. The circuit of claim 9, wherein said fourth and fifth bias means comprise a single bias circuit for commonly applying said first, second, third, fourth, fifth, sixth and seventh constant current means with an operating voltage, respectively.

* * * * *

UNITED STATES PATENT OFFICE

CERTIFICATE OF CORRECTION

Patent No. 3,947,637 Dated March 30, 1976

Inventor(s) Kunio SEKI and Susumu TAKAHASHI

It is certified that error appears in the above-identified patent and that said Letters Patent are hereby corrected as shown below:

Title Page as it now reads:

[73] Assignee: Hitachi, Ltd., Japan

Title Page as it should read:

[73] Assignee: Hitachi, Ltd., and
Sansui Electric Co., Ltd.
Tokyo, Japan

Signed and Sealed this

Ninth Day of November 1976

[SEAL]

*Attest:*

RUTH C. MASON
*Attesting Officer*

C. MARSHALL DANN
*Commissioner of Patents and Trademarks*